United States Patent
Kwon

(10) Patent No.: US 9,865,638 B2
(45) Date of Patent: Jan. 9, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventor: Doo Won Kwon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/352,986

(22) Filed: Nov. 16, 2016

(65) Prior Publication Data
US 2017/0179181 A1    Jun. 22, 2017

(30) Foreign Application Priority Data
Dec. 16, 2015 (KR) .................. 10-2015-0179709

(51) Int. Cl.
    H01L 27/146    (2006.01)
    H01L 25/16     (2006.01)
    H01L 23/00     (2006.01)

(52) U.S. Cl.
    CPC ........ *H01L 27/14634* (2013.01); *H01L 24/13* (2013.01); *H01L 24/16* (2013.01); *H01L 25/167* (2013.01); *H01L 27/1469* (2013.01); *H01L 27/14636* (2013.01); *H01L 27/14687* (2013.01); *H01L 2224/13147* (2013.01); *H01L 2224/16145* (2013.01); *H01L 2225/06524* (2013.01); *H01L 2225/06527* (2013.01); *H01L 2225/06544* (2013.01)

(58) Field of Classification Search
    USPC ........................................................ 257/621
    See application file for complete search history.

(56) References Cited

U.S. PATENT DOCUMENTS

| | | | |
|---|---|---|---|
| 7,714,403 B2 | 5/2010 | Lee et al. | |
| 8,193,023 B2 | 6/2012 | Ahn | |
| 8,530,820 B2 | 9/2013 | Matsunuma | |
| 8,921,901 B1 | 12/2014 | Kao | |
| 9,123,617 B2 | 9/2015 | Wan et al. | |
| 2010/0264521 A1* | 10/2010 | Wood .................. | H01L 23/3114 257/621 |
| 2013/0320197 A1 | 12/2013 | Asayama et al. | |
| 2014/0042298 A1 | 2/2014 | Wan et al. | |
| 2014/0175592 A1 | 6/2014 | Iwabuchi et al. | |

FOREIGN PATENT DOCUMENTS

JP           5682638         1/2015

* cited by examiner

*Primary Examiner* — Zandra Smith
*Assistant Examiner* — Lawrence Tynes, Jr.
(74) *Attorney, Agent, or Firm* — Volentine & Whitt, PLLC

(57) ABSTRACT

A semiconductor device includes a first semiconductor substrate having a first wiring layer which includes a first conductive pad, a second semiconductor substrate disposed on the first semiconductor substrate and including a second wiring layer which includes a second conductive pad, a first oxide layer disposed on the second semiconductor substrate and containing a second end of an intermediate connection which extends vertically through the second semiconductor substrate and has a first end electrically connected to the second conductive pad, and a third semiconductor substrate disposed on the first oxide layer and including a third wiring layer which includes a third conductive pad. The second end of the intermediate connection layer is electrically connected to the third conductive pad via a metal bond.

20 Claims, 16 Drawing Sheets

1200

1300

1400

SEMICONDUCTOR DEVICE AND METHOD OF MANUFACTURING THE SAME

This application claims priority to Korean Patent Application No. 10-2015-0179709 filed on Dec. 16, 2015 in the Korean Intellectual Property Office, the disclosure of which is hereby incorporated by reference in its entirety.

BACKGROUND

1. Field of the Inventive Concept

The inventive concept relates to a semiconductor device and to a method of manufacturing the same. In particular, the inventive concept relates to a semiconductor device having circuits located at different levels in the device and interconnections between the circuits, and to a method of manufacturing the same.

2. Description of the Related Art

Examples of an image sensor used in a digital camera, a digital video camera, a Smartphone, or a portable computer include a complementary metal oxide semiconductor (CMOS) image sensor and a charge coupled device (CCD) image sensor. Such image sensors may include a sensing circuit having a pixel array and circuitry on the periphery of the pixel array, a logic circuit driving the sensing circuit, and a memory circuit storing image sensing data.

To realize the image sensor, circuits such as those mentioned above and having different functions may be stacked, in which case, electrical connections are required to be provided between the circuits while being sufficiently insulated to be effective.

SUMMARY

According to an aspect of the inventive concept, there is provided a semiconductor device including a first semiconductor substrate including a first wiring layer which has a first conductive pad therein, a second semiconductor substrate disposed on the first semiconductor substrate and including a second wiring layer which has a second conductive pad therein, an intermediate connection extending vertically in the second semiconductor substrate and having a first end, at which the intermediate connection is electrically connected to the second conductive pad, and a second end, a first oxide layer disposed on the second semiconductor substrate and containing the second end of the intermediate connection, and a third semiconductor substrate disposed on the first oxide layer and including a third wiring layer having a third conductive pad therein, and in which the second end of the intermediate connection is electrically connected to the third conductive pad via a metal bond.

According to another aspect of the inventive concept, there is provided a semiconductor device including a first semiconductor substrate including a first wiring layer having a first conductive pad therein, a second semiconductor substrate disposed on the first semiconductor substrate and including a second wiring layer having a second conductive pad therein, a first oxide layer disposed on the second semiconductor substrate, third semiconductor substrate disposed on the first oxide layer and including a third wiring layer having a third conductive pad therein, an intermediate connection extending vertically in the device within the semiconductor substrate and the first oxide layer, and bodies of metal located at respective surfaces of the first oxide layer and the third wiring layer and facing each other so as to collectively constitute a metal bond.

According to yet another aspect of the inventive concept, there is provided a semiconductor device including a first semiconductor substrate, a second semiconductor substrate disposed on and bonded to the first semiconductor substrate, a first oxide layer disposed on the second semiconductor substrate, a third semiconductor substrate disposed on and bonded to the second semiconductor substrate, and an intermediate connection extending vertically in the second semiconductor substrate and into the first oxide layer. The first semiconductor substrate includes a first circuit layer and a first wiring layer of the device, and the first circuit layer comprises a first integrated circuit (IC) electrically connected to the first wiring layer. The second semiconductor substrate includes a second circuit layer and a second wiring layer of the device having a conductive pad, and the second circuit layer comprises a second integrated circuit (IC) electrically connected to the second wiring layer. The second wiring layer is disposed face-to-face with and is electrically connected to the first wiring layer. The intermediate connection has a first end, at which the intermediate connection is electrically connected to the conductive pad of the second wiring layer, and a second end extending within the first oxide layer. The third semiconductor substrate includes a third circuit layer and a third wiring layer of the device having a conductive pad, and the third circuit layer comprises a third integrated circuit (IC) electrically connected to the third wiring layer. Also, the third wiring layer is disposed face-to-face with the second wiring layer such that an interface exists between the third wiring layer and the second wiring layer. The semiconductor device also has an integral metal body extending across the interface between the third wiring layer and the second wiring layer, and the second end of the intermediate connection layer is electrically connected to the conductive pad of the third wiring layer via the metal body. Thus, a metal bond exists between the intermediate connection and the conductive pad of the third wiring layer.

DETAILED DESCRIPTION

Figure 1:
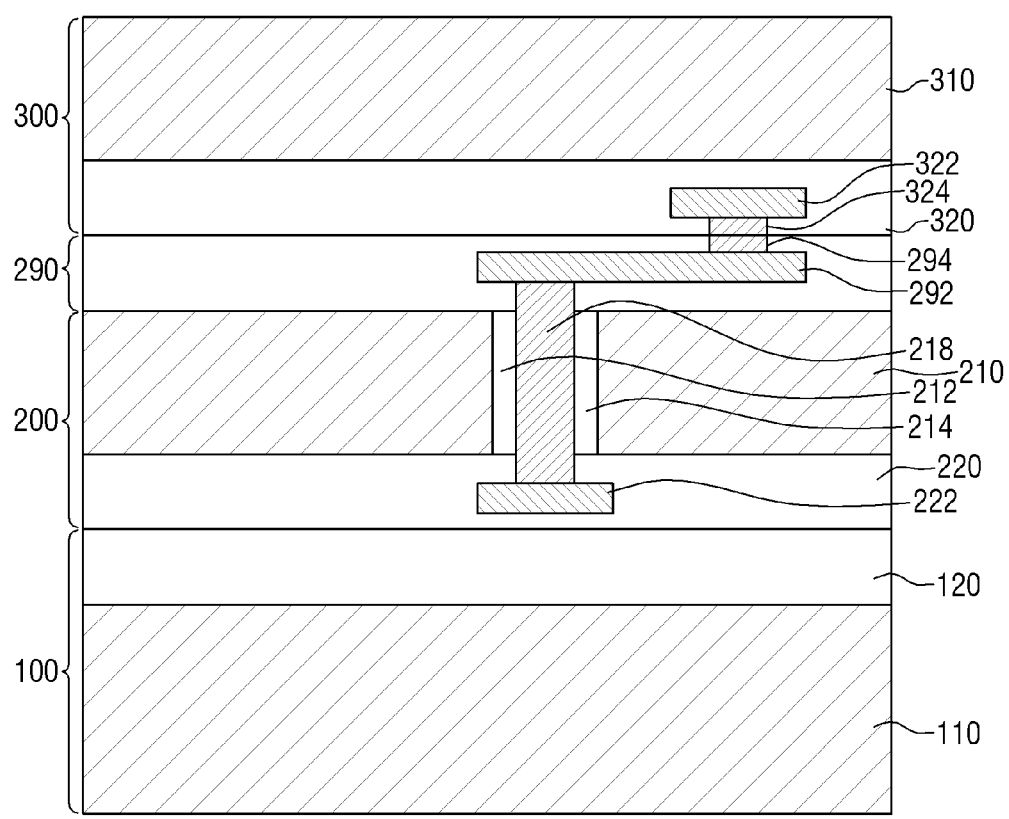
FIG. 1 is a schematic cross-sectional view of an example of a semiconductor device according to the inventive concept.

The inventive concept will be described in detail with reference to the accompanying drawings. The inventive concept, however, may be exemplified in various different forms, and should not be construed as being limited only to the illustrated examples. Rather, these examples are provided as so that this disclosure will be thorough and complete, and will fully convey the concept of the inventive concept to those skilled in the art. Accordingly, known processes, elements, and techniques are not described with respect to some of the examples of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

Advantages and features of the present inventive concept and methods of accomplishing the same may be understood more readily by reference to the following detailed description and the accompanying drawings.

FIG. 1 is a schematic cross-sectional view of an example of a semiconductor device according to the inventive concept.

Referring to FIG. 1, this example of a semiconductor device according to the inventive concept includes a first semiconductor substrate 100, a second semiconductor substrate 200, and a third semiconductor substrate 300 stacked one on the other. The semiconductor device may also include a first oxide layer 290 between the second and third semiconductor substrates 200 and 300. The semiconductor device may constitute an image sensor. In some examples, the image sensor includes a sensing circuit, a logic circuit, and a memory circuit.

The sensing circuit includes a pixel array, which converts light into an electric signal, and a control circuit, which controls the pixel array. The logic circuit includes circuitry for controlling not only the operation of the sensing circuit, but also the operation of the image sensor in general, and for controlling communications with an external device. The memory circuit includes circuitry for storing image sensing data.

In the present example, any one of the first, second, and third semiconductor substrates 100, 200, and 300 may include any one of the sensing circuit, the logic circuit, and the memory circuit of the image sensor. For example, the first semiconductor substrate 100 may include the memory circuit, the second semiconductor substrate 200 may include the logic circuit, and the third semiconductor substrate 300 may include the sensing circuit. However, the inventive concept is not limited to this example, and the order in which the first, second, and third semiconductor substrates 100, 200, and 300 are stacked may vary according to particular implementations of the image sensor.

Referring again to FIG. 1, the first semiconductor substrate 100 includes a first circuit layer 110 and a first wiring layer 120. The first circuit layer 110 contains a circuit, and the first wiring layer 120 contains wiring for electrically connecting the circuit to an external circuit. For example, in a case in which the first semiconductor substrate 100 is the memory circuit, the first circuit layer 110a may comprise a memory cell array, and the first wiring layer 120 may comprise conductive pads for exchanging signals with the memory cell array.

The second semiconductor substrate 200, like the first semiconductor substrate 100, includes a second circuit layer 210 and a second wiring layer 220, and the third semiconductor substrate 300, like the first and second semiconductor substrates 100 and 200, includes a third circuit layer 310 and a third wiring layer 320.

In the present example, the second wiring layer 220 of the second semiconductor substrate 200 includes a conductive pad 222. Examples of the conductive pad 222 include an aluminum (Al) pad, which comprises Al, but the inventive concept is not limited thereto. That is, the conductive pad 222 may be formed of virtually any metal with high electrical conductivity. The third wiring layer 320 of the third semiconductor substrate 300 includes a conductive pad 322.

To electrically connect the conductive pad 222 of the second semiconductor substrate 200 and the conductive pad 322 of the third semiconductor substrate 300, the semiconductor device according to the present example includes an intermediate connection 218, an interconnect metal (IM) 292, and a metal bond 294 and 324.

The intermediate connection 218 is formed to vertically penetrate the second semiconductor substrate 200. More specifically, a first end of the intermediate connection 218 is electrically connected to the conductive pad 222 of the second semiconductor substrate 200, and a second end of the intermediate connection 218 protrudes into the first oxide layer 290. In various examples, the intermediate connection 218 may comprise copper (Cu) or tungsten (W), but the inventive concept is not limited thereto. That is, the intermediate connection 218 may comprise virtually any metal with high electrical conductivity. In some examples, the second semiconductor substrate 200 may also include spacers 212 and 214, which surround the intermediate connection 218 and provide insulation between the intermediate connection 218 and the second circuit layer 210.

The IM 292 is disposed on the intermediate connection 218 and provides an electrical connection between the conductive pad 222 in the second wiring layer 220 and a conductive pad horizontally spaced from the conductive pad 222, such as the conductive pad 322 in the third wiring layer 320. In various examples, the IM 292 may comprise Cu or W, but the inventive concept is not limited thereto. That is, the IM 292 may comprise virtually any metal with high electrical conductivity. Also, the IM 292 may constitute a metallization layer within the oxide layer 290.

An upper portion (i.e., the second end) of the intermediate connection 218 and the IM 292 may be formed on the first oxide layer 290. The third semiconductor substrate 300 may also be disposed in the first oxide layer 290.

The metal bond 294 and 324 includes a body or bump of metal 294, which is disposed on the IM 292, and a body or bump of metal 324, which is disposed below the conductive pad 322. In some examples, the metal bond 294 and 324 may comprise a Cu—Cu bond, but the inventive concept is not limited thereto. That is, the metal bond 294 and 324 may comprise (bonded bodies of) virtually any metal with high electrical conductivity.

The conductive pad 222 of the second semiconductor substrate 200 and the conductive pad 322 of the third semiconductor substrate 300 may be electrically connected via the intermediate connection 218, the IM 292, and the metal bond 294 and 324.

In the present example, the top surface of the first wiring layer 120 of the first semiconductor substrate 100 and the bottom surface of the second wiring layer 220 of the second semiconductor substrate 200 are bonded together to form a surface of contact, and the top surface of the first oxide layer 290 and the bottom surface of the third wiring layer 320 of the third semiconductor substrate 300 are bonded together to form a surface of contact.

Figure 2:
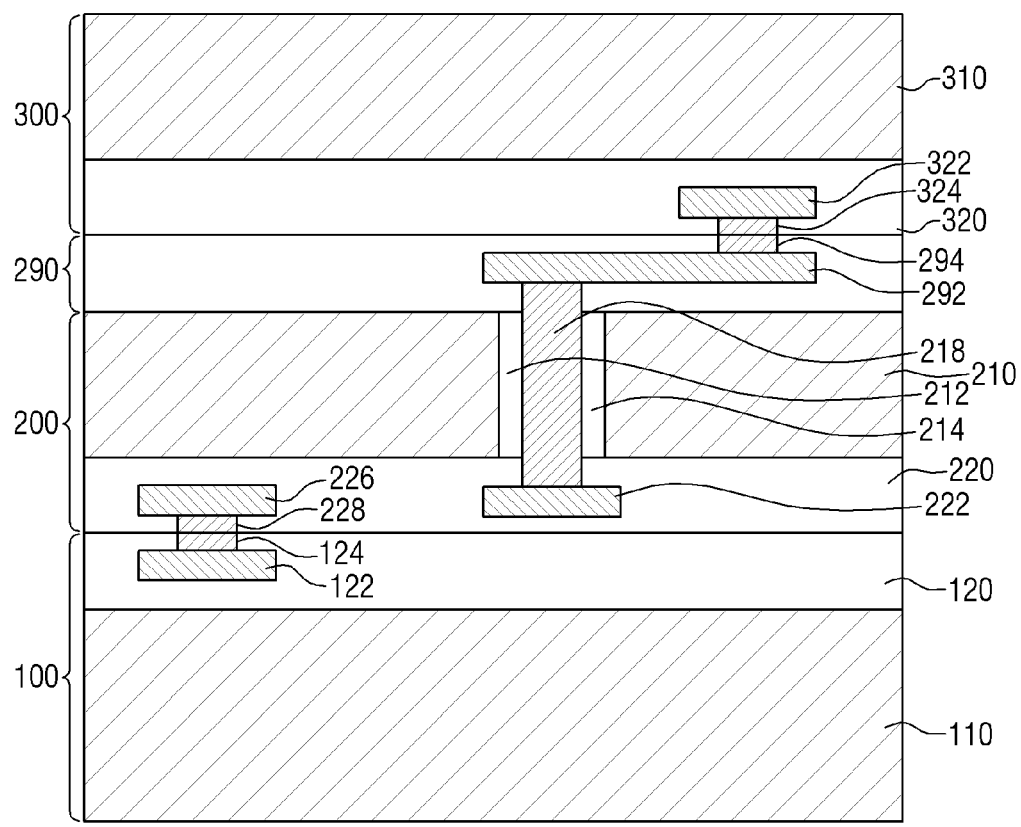
FIG. 2 is a schematic cross-sectional view of another example of a semiconductor device according to the inventive concept.

FIG. 2 is a schematic cross-sectional view of another example of a semiconductor device according to the inventive concept.

Referring to FIG. 2, a semiconductor device according to the present example differs from the semiconductor device of the example of FIG. 1 in that an electrical connection is interposed between a conductive pad 122, which is disposed in a first wiring layer 120 of a first semiconductor substrate 100, and a conductive pad 226 which is disposed in a second wiring layer 220 of a second semiconductor substrate 200. The conductive pads 222 and 226 may be parts of the same interlayer metallization (layer of metal) of the second wiring layer 220. That is, the conductive pads 222 and 226 may be sandwiched between insulating layers of the second wiring layer 220. Likewise, the conductive pad 122 may constitute interlayer metallization of the first wiring layer 120.

In the present example, the conductive pad 122 of the first semiconductor substrate 100 and the conductive pad 226 of the second semiconductor substrate 200 are electrically connected via a metal bond 124 and 228. The metal bond 124 and 228 includes a body or more specifically, a bump, of metal 124 disposed on the conductive pad 122, and a body or bump of metal 228, which is disposed below the conductive pad 226. In some examples, the metal bond 124 and 228 may comprise bonded bodies of copper (Cu), i.e., may provide a "Cu—Cu" bond, but the inventive concept is not limited thereto. That is, the metal bond 124 and 228 may comprise bonded bodies of virtually any metal with high electrical conductivity. Such bonded bodies collectively may be referred to hereinafter as an integral body of metal.

The conductive pad 122 of the first semiconductor substrate 100 and the conductive pad 226 of the second semiconductor substrate 200 may be electrically connected via the metal bond 124 and 228, and a conductive pad 222 of the second semiconductor substrate 200 and a conductive pad 322 of a third semiconductor substrate 300 may be electrically connected via an intermediate connection 218, an IM 292, and a metal bond 294 and 324. The conductive pad 322 may constitute interlayer metallization of the third wiring layer 320.

Figure 3:
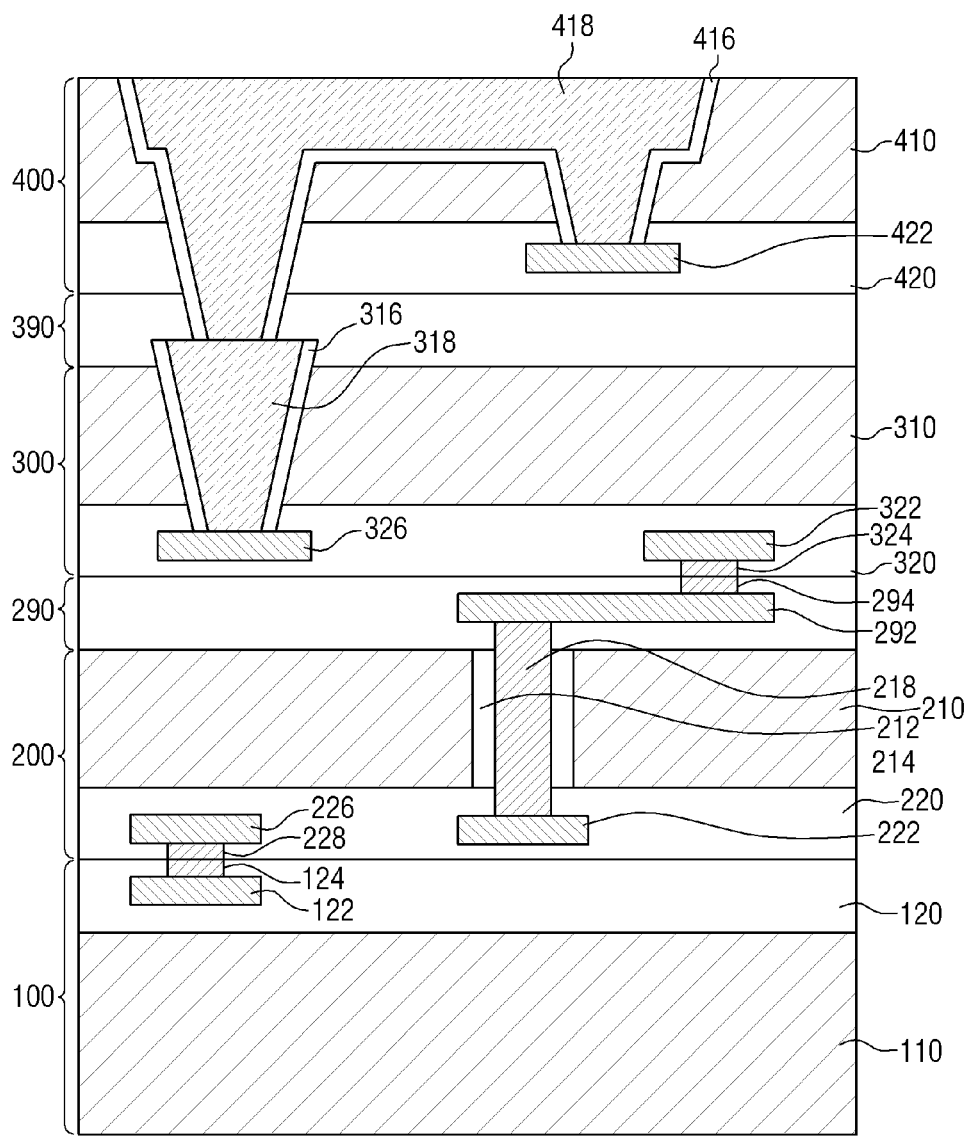
FIG. 3 is a schematic cross-sectional view of another example of a semiconductor device according to the inventive concept.

FIG. 3 is a schematic cross-sectional view of another example of a semiconductor device according to the inventive concept.

Referring to FIG. 3, a semiconductor device according to the present example differs from the semiconductor device of the example of FIG. 2 in that it further includes an oxide layer 390, which is disposed on a third semiconductor substrate 300, and a fourth semiconductor substrate 400 which includes a fourth circuit layer 410 and a fourth wiring layer 420, and that an electrical connection is interposed between a conductive pad 326, which is disposed in a third wiring layer 320 of the third semiconductor substrate 300, and a conductive pad 422 which is disposed in the fourth wiring layer 420 of the fourth semiconductor substrate 400.

In the present example, the conductive pad 326 of the third semiconductor substrate 300 and the conductive pad 422 of the fourth semiconductor substrate 400 form an electrical connection via penetrating electrodes 318 and 418. The penetrating electrodes 318 and 418 include a first penetrating electrode 318, which penetrates the third semiconductor substrate 300, and a second penetrating electrode 418 which is electrically connected to the first penetrating electrode 318 and penetrates the fourth semiconductor substrate 400. In various examples, the penetrating electrodes 318 and 418 may comprise Cu or W, but the inventive concept is not limited thereto. That is, the penetrating electrodes 318 and 418 may comprise virtually any metal with high electrical conductivity. In some examples, the third and fourth semiconductor substrates 300 and 400 may also include spacers 316 and 416, respectively, which provide insulation between the first penetrating electrode 318 and a third circuit layer 310 and between the second penetrating electrode 418 and the fourth circuit layer 410.

A conductive pad 122 of a first semiconductor substrate 100 and a conductive pad 226 of a second semiconductor substrate 200 may be electrically connected via a metal bond 124 and 228, a conductive pad 222 of the second semiconductor substrate 200 and a conductive pad 322 of the third semiconductor substrate 300 may be electrically connected via an intermediate connection 218, an IM 292, and a metal bond 294 and 324, and the conductive pad 326 of the third semiconductor substrate 300 and the conductive pad 422 of the fourth semiconductor substrate 400 may be electrically connected via the penetrating electrodes 318 and 418.

Figure 4:
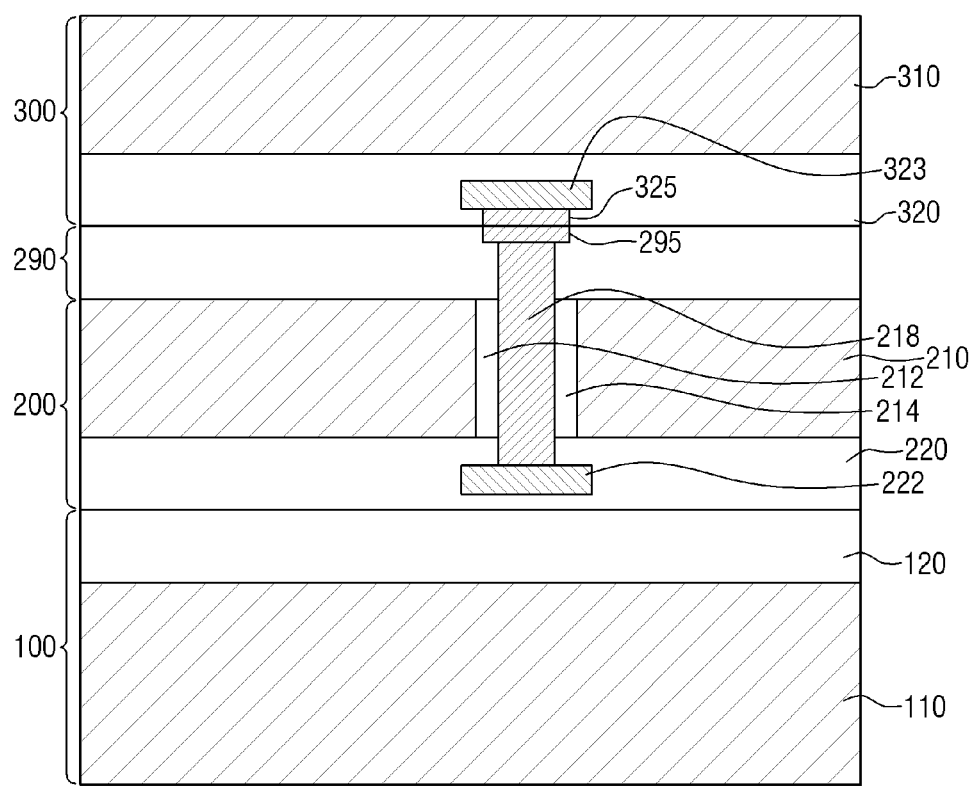
FIG. 4 is a schematic cross-sectional view of another example of a semiconductor device according to the inventive concept.

FIG. 4 is a schematic cross-sectional view of another example of a semiconductor device according to the inventive concept.

Referring to FIG. 4, the semiconductor device according to the present example includes an intermediate connection 218 and a metal bond 295 and 325 to electrically connect the conductive pad 222 of the second semiconductor substrate 200 and the conductive pad 323 of the third semiconductor substrate 300.

The intermediate connection 218 vertically penetrates the second semiconductor substrate 200. More specifically, a first end of the intermediate connection 218 is electrically connected to the conductive pad 222 of the second semiconductor substrate 200, and a second end of the intermediate connection 218 protrudes into a first oxide layer 290. In various examples, the intermediate connection 218 may comprise Cu or W, but the inventive concept is not limited thereto. That is, the intermediate connection 218 may comprise virtually any metal with high electrical conductivity. In some examples, the second semiconductor substrate 200 may also include spacers 212 and 214, which surround the intermediate connection 218 and provide insulation between the intermediate connection 218 and a second circuit layer 210.

An upper portion (i.e., the second end) of the intermediate connection 218 may be disposed in the first oxide layer 290.

The metal bond 295 and 325 includes a body or bump of metal 295, which contacts the top surface of the intermediate connection 218, and a body or bump of metal 325, which is disposed below the conductive pad 323. In some examples, the metal bond 295 and 325 may comprise a Cu—Cu bond, but the inventive concept is not limited thereto. That is, the metal bond 295 and 325 may comprise a bond between virtually any bodies or bumps of metal with high electrical conductivity.

The conductive pad 222 of the second semiconductor substrate 200 and the conductive pad 323 of the third semiconductor substrate 300 may be electrically connected via the intermediate connection 218 and the metal bond 295 and 325.

Figure 5:
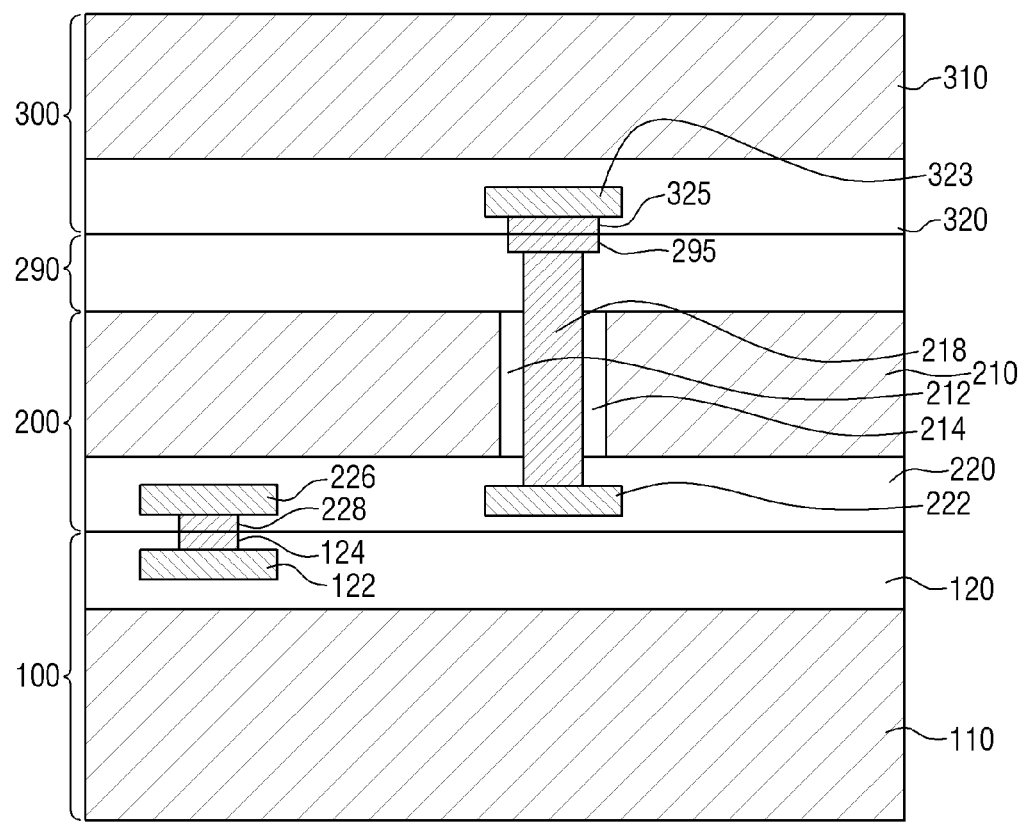
FIG. 5 is a schematic cross-sectional view of another example of a semiconductor device according to the inventive concept.

FIG. 5 is a schematic cross-sectional view of another example of a semiconductor device according to the inventive concept.

Referring to FIG. 5, a semiconductor device according to the present example differs from the semiconductor device of the example of FIG. 4 in that an electrical connection is additionally interposed between a conductive pad 122, which is disposed in a first wiring layer 120 of a first semiconductor substrate 100, and a conductive pad 226 which is disposed in a second wiring layer 220 of a second semiconductor substrate 200.

In the present example, the conductive pad 122 of the first semiconductor substrate 100 and the conductive pad 226 of the second semiconductor substrate 200 may form an electrical connection via a metal bond 124 and 228. The metal bond 124 and 228 includes a body or bump of metal 124, which is disposed on the conductive pad 122, and a body or bump of metal 228 which is disposed below the conductive pad 226. In some examples, the metal bond 124 and 228 may comprise a Cu—Cu bond, but the inventive concept is not limited thereto. That is, the metal bond 124 and 228 may comprise a bond between bodies or bumps of virtually any metal with high electrical conductivity.

The conductive pad 122 of the first semiconductor substrate 100 and the conductive pad 226 of the second semiconductor substrate 200 may be electrically connected via the metal bond 124 and 228, and the conductive pad 222 of the second semiconductor substrate 200 and a conductive pad 323 of a third semiconductor substrate 300 may be electrically connected via an intermediate connection 218 and a metal bond 295 and 325.

Figure 6:
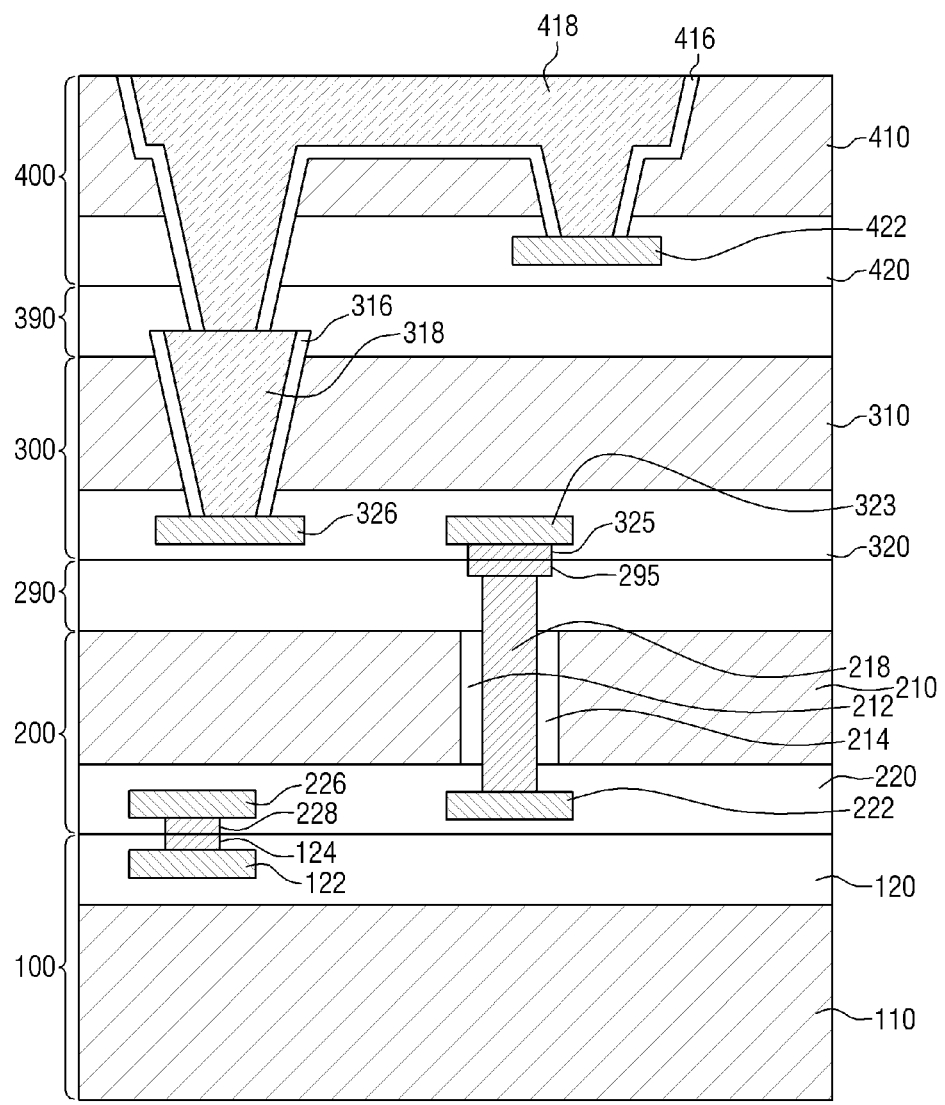
FIG. 6 is a schematic cross-sectional view of another example of a semiconductor device according to the inventive concept.

FIG. 6 is a schematic cross-sectional view of another example of a semiconductor device according to the inventive concept.

Referring to FIG. 6, a semiconductor device according to the present example differs from the semiconductor device of the example of FIG. 5 in that it further includes an oxide layer 390, which is disposed on a third semiconductor substrate 300, and a fourth semiconductor substrate 400 which includes a fourth circuit layer 410 and a fourth wiring layer 420, and that an electrical connection is interposed between a conductive pad 326, which is disposed in a third wiring layer 320 of the third semiconductor substrate 300, and a conductive pad 422 which is disposed in the fourth wiring layer 420 of the fourth semiconductor substrate 400.

In the present example, the conductive pad 326 of the third semiconductor substrate 300 and the conductive pad 422 of the fourth semiconductor substrate 400 form an electrical connection via penetrating electrodes 318 and 418. The penetrating electrodes 318 and 418 include a first penetrating electrode 318, which penetrates the third semiconductor substrate 300, and a second penetrating electrode 418 which is electrically connected to the first penetrating electrode 318 and penetrates the fourth semiconductor substrate 400. In various examples, the penetrating electrodes 318 and 418 may comprise Cu or W, but the inventive concept is not limited thereto. That is, the penetrating electrodes 318 and 418 may comprise virtually any metal with high electrical conductivity. In some examples, the third and fourth semiconductor substrates 300 and 400 may also include spacers 316 and 416, respectively, which provide insulation between the first penetrating electrode 318 and a third circuit layer 310 and between the second penetrating electrode 418 and the fourth circuit layer 410.

A conductive pad 122 of a first semiconductor substrate 100 and a conductive pad 226 of a second semiconductor substrate 200 may be electrically connected via a metal bond 124 and 228, a conductive pad 222 of the second semiconductor substrate 200 and a conductive pad 322 of the third semiconductor substrate 300 may be electrically connected via an intermediate connection 218 and a metal bond 295 and 325, and the conductive pad 326 of the third semiconductor substrate 300 and the conductive pad 422 of the fourth semiconductor substrate 400 may be electrically connected via the penetrating electrodes 318 and 418.

Figure 7:
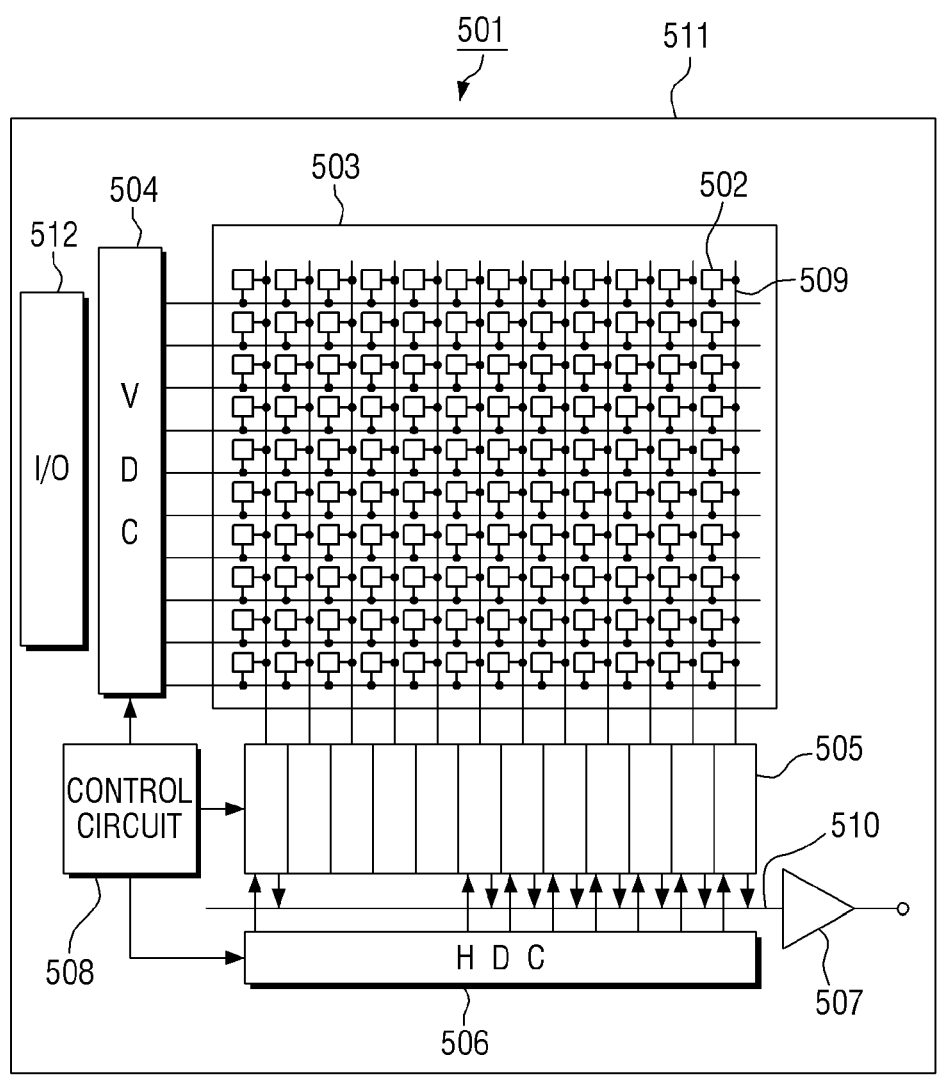
FIGS. 7 and 8 are a schematic diagram of an image sensor and a block diagram, of an electronic device having an image sensor, which may employ a semiconductor device according the inventive concept.
Figure 8:
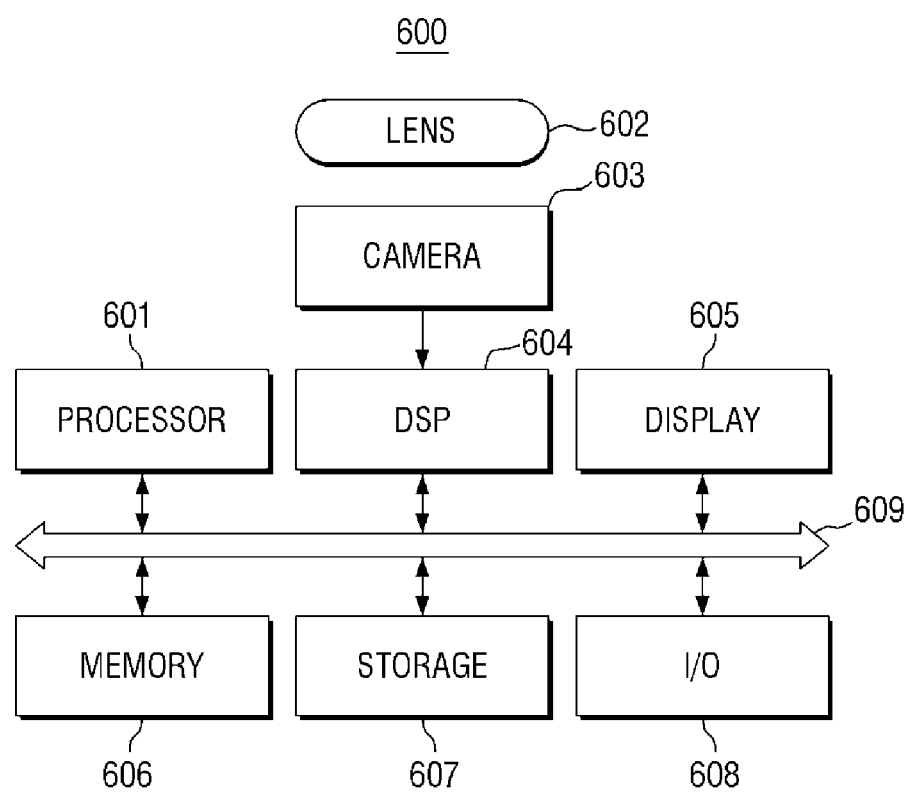

FIGS. 7 and 8 are a schematic and block diagrams for use in explaining the application of a semiconductor device according to the inventive concept to an image sensor.

Referring to FIG. 7, an image sensor 501 to which a semiconductor device according to the inventive concept may be applied may include a pixel array 503 having a plurality of pixels 502, a vertical driving circuit (VDC) 504, a column signal processing circuit 505, a horizontal driving circuit (HDC) 506, a control circuit 508, and an input/output (I/O) terminal 512.

Referring to FIG. 8, an electronic device 600 in the form of or having a camera comprising an image sensor including a semiconductor device according to the inventive concept may include a processor 601, a lens 602, an image pickup device 603, a digital signal processor (DSP) 604, a display device 605, a memory device 606, a storage device 607, and an I/O device 608. The processor 601, the DSP 604, the display device 605, the memory device 606, the storage device 607, and the I/O device 608 may exchange data with one another via a bus 609.

Therefore, in some examples of a semiconductor device according to the inventive concept, the circuit layer 110 of the first semiconductor substrate 100 may comprise an IC constituting the memory device 606, the circuit layer 210 of the second semiconductor substrate 200 may comprise an IC constituting the processor, and the circuit layer 310 of the third semiconductor substrate 300 may comprise an IC constituting the image pick-up device 603 (including a pixel array 503, control circuit 508, etc. shown in FIG. 7).

FIGS. 9 through 14 illustrate an example of a method of manufacturing a semiconductor device, according to the inventive concept.

Figure 9:
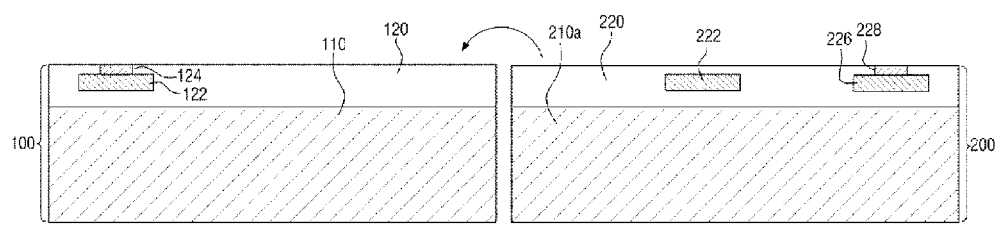
FIGS. 9, 10, 11, 12, 13 and 14 are schematic cross-sectional views of a semiconductor device during the course of its manufacture and together illustrate an example of a method of manufacturing the semiconductor device according to the inventive concept.
Figure 14:
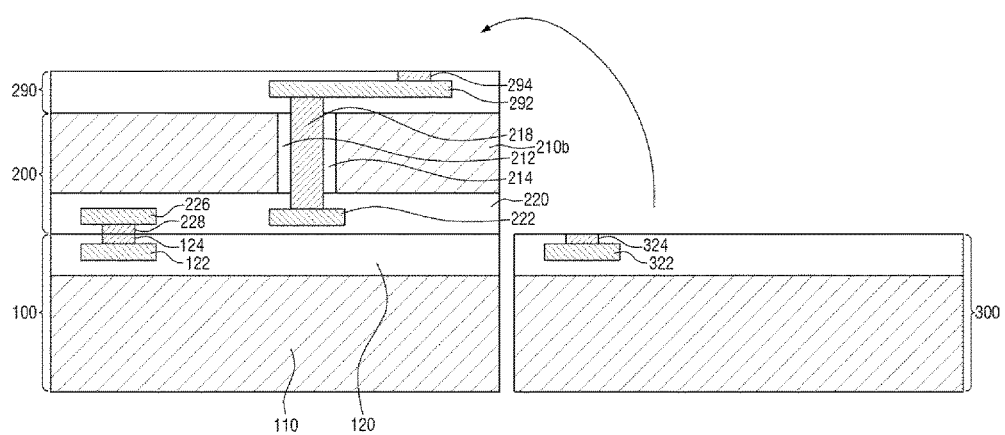

Referring to FIG. 9, a first semiconductor substrate 100, which includes a first circuit layer 110 and a first wiring layer 120, and a second semiconductor substrate 200, which includes a second circuit layer 210a and a second wiring layer 220, are provided or fabricated according to techniques known in the art per se. Referring to FIG. 14, a third semiconductor substrate 300, which includes a third circuit layer 310 and a third wiring layer 320, is also provided or fabricated according to techniques known in the art per se.

The first wiring layer 120 includes a conductive pad 122 and a body or bump of metal 124 disposed on the conductive pad 122, and the second wiring layer 220 includes a conductive pad 226 and a body or bump of metal 228 which is disposed on the conductive pad 226. The second wiring layer 220 also includes a conductive pad 222.

In some examples, the conductive pads 122, 222, and 226 may be formed of or comprise aluminum (Al), but the inventive concept is not limited thereto. That is, the conductive pads 122, 222, and 226 may be formed of virtually any metal with high electrical conductivity.

In some examples, the bodies or bumps of metal 124 and 228 may be formed of or comprise Cu or W, but the inventive concept is not limited thereto. That is, the bodies or bumps of metal 124 and 228 may comprise virtually any metal with high electrical conductivity.

Figure 10:
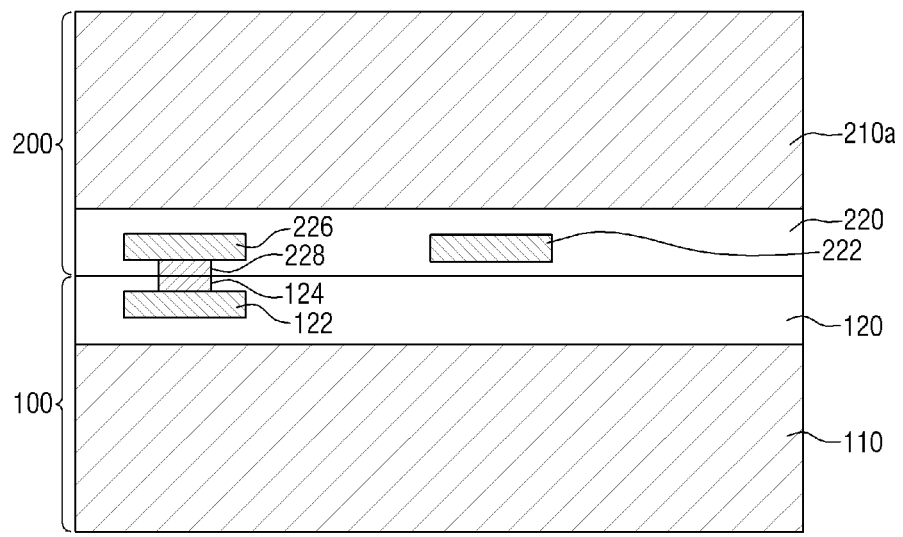

Referring to FIG. 10, the first and second semiconductor substrates 100 and 200 are bonded face to face such that a metal bond 124 and 228 is formed between the conductive pad 122, which is disposed in the first wiring layer 120, and the conductive pad 226 which is disposed in the second wiring layer 220. The first and second semiconductor substrates 100 and 200 may be moved in any of various directions relative to each other to facilitate such bonding, and may have any of various orientations (e.g., top side up or top side down) at the time they are bonded to one another.

Thus, as a result, the conductive pad 122 of the first semiconductor substrate 100 and the conductive pad 226 of the second semiconductor substrate 200 are electrically connected via the metal bond 124 and 228.

In the present example, the first and second semiconductor substrates 100 and 200 are bonded by bonding the top surface of the first wiring layer 120 and the bottom surface of the second wiring layer 220, but the bonding of the substrate along these surfaces may be carried out while the substrates are oriented in any of various directions.

Figure 11:
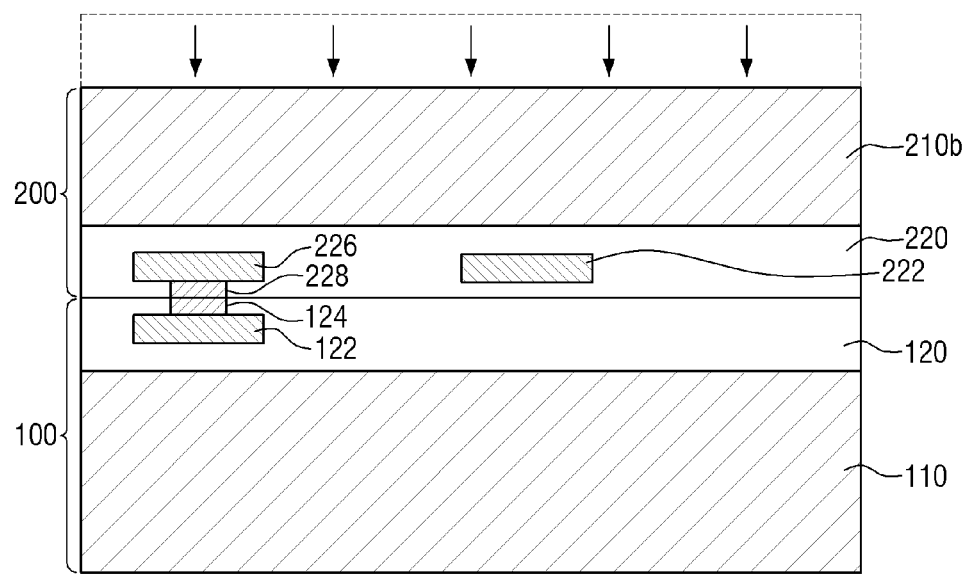

Referring to FIG. 11, after the bonding of the first and second semiconductor substrates 100 and 200, the second semiconductor substrate 200 is thinned. More specifically, the second circuit layer 210a is thinned to form a thinner second circuit layer 210b.

Figure 12:
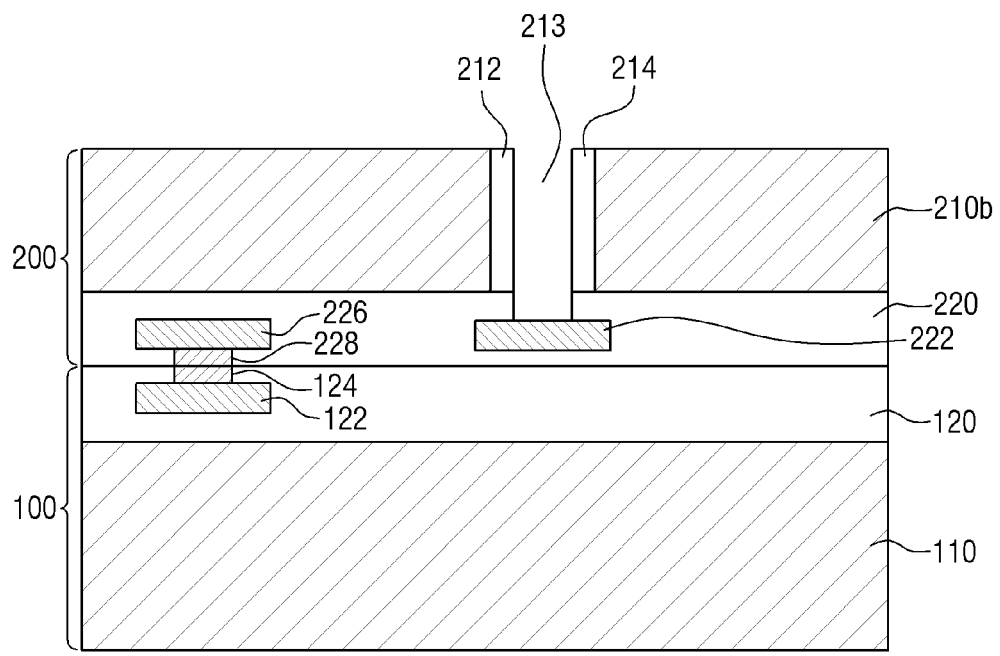

Referring to FIG. 12, an opening 213 is formed to expose the top surface of the conductive pad 222 of the second semiconductor substrate 200.

In some examples, the forming of the opening 213 may involve forming spacers 212 and 214 in the second circuit layer 210b of the second semiconductor substrate 200 and forming the opening 213 using the spacers 212 and 214 as etch stopper layers. Accordingly, the opening 213 may be delimited by the spacers 212 and 214.

Figure 13:
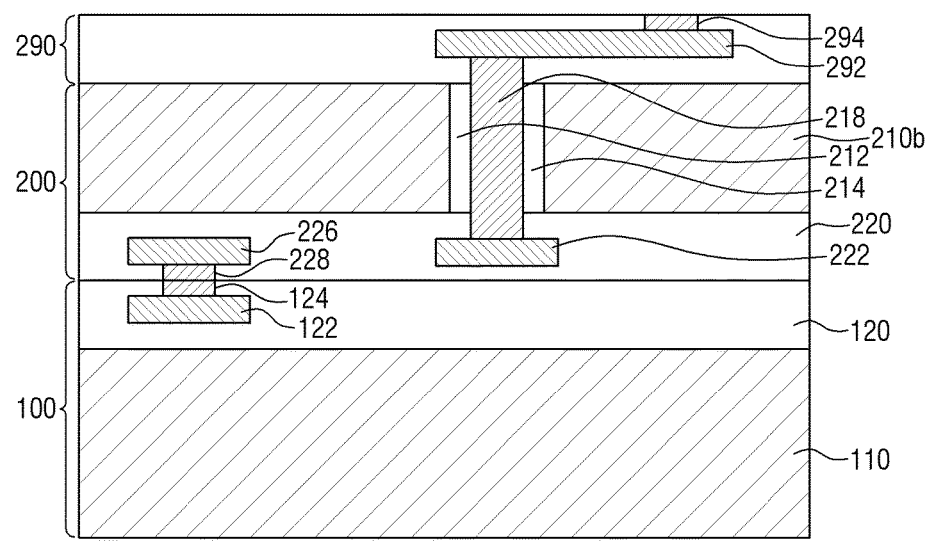

Subsequently, and referring to FIG. 13, an intermediate connection 218, which is electrically connected to the conductive pad 222, is formed in the opening 213, and a first oxide layer 290 is formed on the semiconductor substrate 200.

In the present example, the formation of the first oxide layer 290 may involve forming an IM 292, which electrically connects the intermediate connection 218 and a conductive pad 322 which will be described hereinafter with reference to FIG. 14.

Referring to FIG. 14, a metal bond 294 and 324 is formed between the intermediate connection 218 and the conductive pad 322 of the third wiring layer 320 by bonding the third semiconductor substrate 300 to the first oxide layer 290.

In the present example, the first oxide layer 290 and the third semiconductor substrate 300 may be bonded by bonding the top surface of the first oxide layer 290 and the bottom surface of the third wiring layer 320 (which is the top surface of the third wiring layer 320 in the orientation illustrated in FIG. 14 yet to be bonded, as). However, the first oxide layer 290 and the third semiconductor substrate 300 may have various orientations other than those illustrated in FIG. 14 at the time they are bonded and likewise, may be moved in any of various directions relative to each other to facilitate such bonding.

Subsequently, the third semiconductor substrate 300 may be thinned. Then the fourth semiconductor substrate 400 described above with reference to FIGS. 3 and 6 may be additionally bonded face-to-face with the third semiconductor substrate 300.

Figure 15:
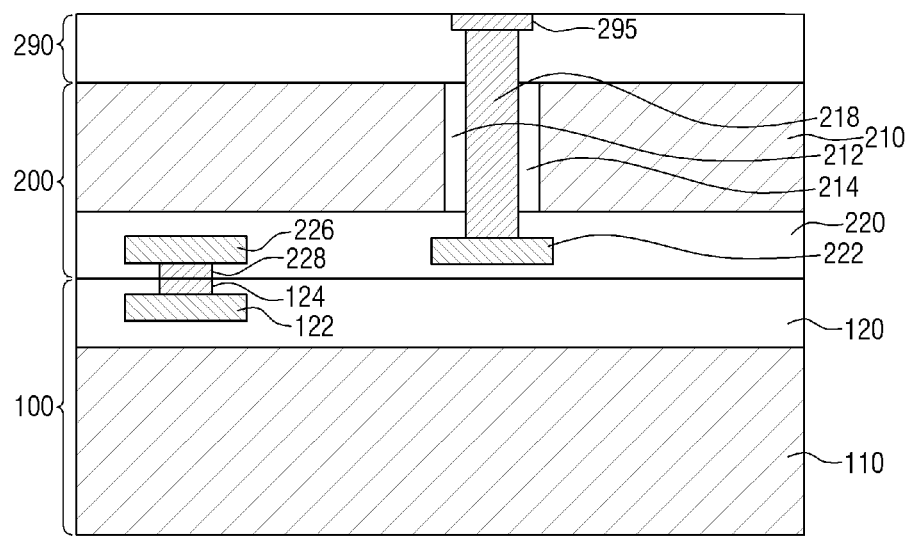
FIGS. 15 and 16 are schematic cross-sectional views of a semiconductor device during the course of its manufacture and together illustrate another example of a method of manufacturing a semiconductor device according to the inventive concept.
Figure 16:
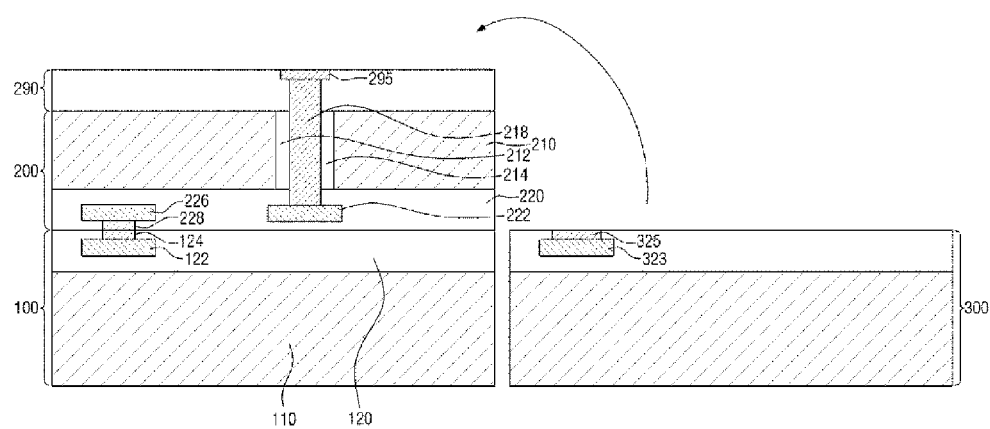

FIGS. 15 and 16 illustrate steps in another example of a method of manufacturing a semiconductor device, according to the inventive concept.

First, steps similar to those shown in and described with reference to FIGS. 9-12 are performed.

Then, and referring to FIG. 15, an intermediate connection 218 is formed in an opening 213 so as to be electrically connected to the conductive pad 222. Also, a first oxide layer 290 is formed on the second semiconductor substrate 200.

Subsequently, and referring to FIG. 16, a metal bond 295 and 325 is formed between the intermediate connection 218 and the conductive pad 323 by bonding the third semiconductor substrate 300 face-to-face with the first oxide layer 290.

Subsequently, the third semiconductor substrate 300 may be thinned. Then, the fourth semiconductor substrate 400 described above with reference to FIGS. 3 and 6 may be additionally bonded to the third semiconductor substrate 300.

Figure 17:
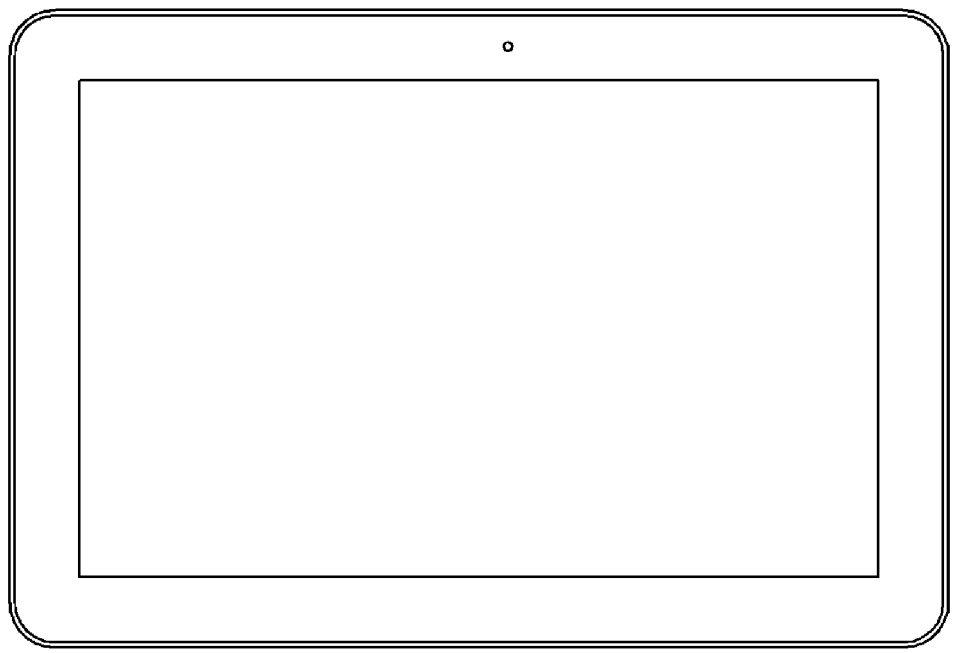
FIGS. 17, 18 and 19 are front views of examples of electronic devices that may each employ a semiconductor device according to the inventive concept.
Figure 18:
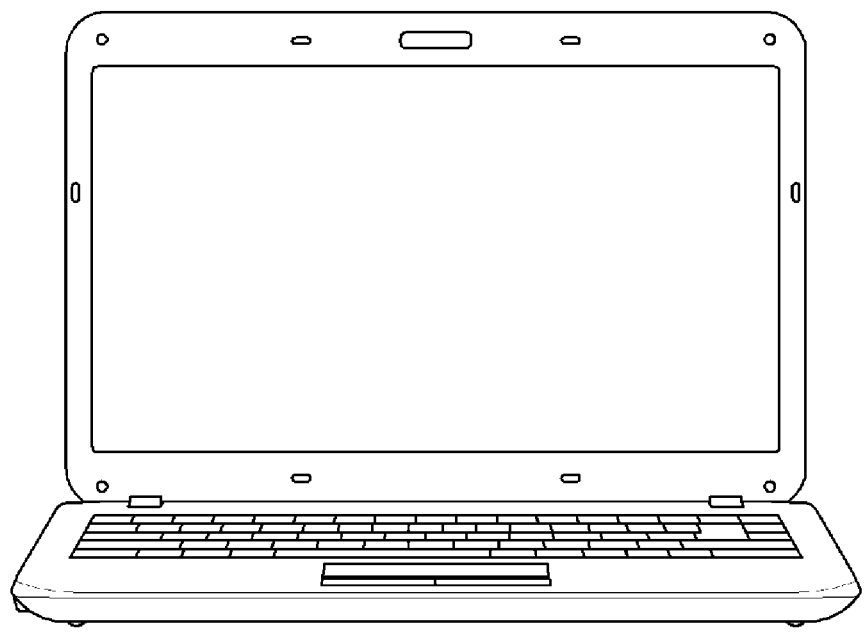
Figure 19:
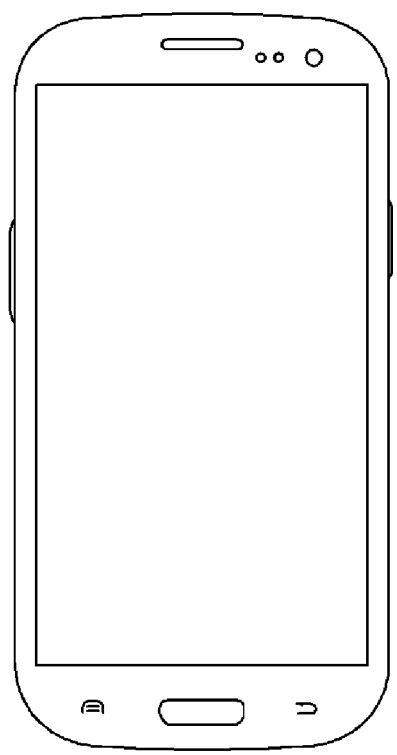

FIGS. 17 through 19 illustrate various examples of electronic devices that may employ or incorporate a semiconductor device according to the inventive concept.

More specifically, FIG. 17 illustrates a tablet PC 1200, FIG. 18 illustrates a notebook computer 1300, and FIG. 19 illustrates a Smartphone 1400. Clearly, though, semiconductor devices according to the inventive concept may also be used in other electronic devices that have various integrated circuits (IC) such as, but not limited to, a desktop computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, or a digital video player.

Although preferred examples of the present inventive concept have been described above for illustrative purposes, those skilled in the art will appreciate that various modifications, additions and substitutions with respect to these disclosed examples are possible, without departing from the scope and spirit of the inventive concept as defined by the accompanying claims.

What is claimed is:
1. A semiconductor device, comprising:
a first semiconductor substrate including a first wiring layer which has a first conductive pad therein;
a second semiconductor substrate disposed on the first semiconductor substrate and including a second wiring layer which has a second conductive pad therein;
an intermediate connection extending vertically in the second semiconductor substrate and having a first end, at which the intermediate connection is electrically connected to the second conductive pad, and a second end;
a first oxide layer disposed on the second semiconductor substrate and containing the second end of the intermediate connection;
a third semiconductor substrate disposed on the first oxide layer and including a third wiring layer having a third conductive pad therein;
a first body of metal embedded in the first oxide layer; and
a second body of metal embedded in the third wiring layer beneath the third conductive pad, the second body of metal contacting a bottom surface of the third conductive pad, wherein a top surface of the first oxide layer contacts a bottom surface of the third wiring layer such that the oxide layer and the third wiring layer have an interface along which surface contact exists between the first oxide layer and the third wiring layer, the first body of metal is integral with the second body of metal to provide a metal bond, and the second end of the intermediate connection is electrically connected to the third conductive pad via the metal bond.

2. The semiconductor device of claim 1, further comprising a layer of interconnect metal (IM) extending within the first oxide layer and which is electrically connected to the intermediate connection at the second end of the intermediate connection.

3. The semiconductor device of claim 2, wherein the second end of the intermediate connection is electrically connected to the third conductive pad via the IM and the metal bond.

4. The semiconductor device of claim 1, wherein the first and second bodies of metal bond are two bodies of copper, respectively, said bodies of copper being bonded directly to one another to provide a copper-to-copper (Cu—Cu) bond.

5. The semiconductor device of claim 1, wherein:
the second wiring layer also has a fourth conductive pad therein; and
the first conductive pad and the fourth conductive pad are electrically connected via a metal bond.

6. The semiconductor device of claim 1, wherein:
the third wiring layer has a fifth conductive pad therein, and
the semiconductor device further comprises a second oxide layer disposed on the third semiconductor substrate, and a fourth semiconductor substrate disposed on the second oxide layer and including a fourth wiring layer having a sixth conductive pad therein; and
further comprising penetrating electrodes electrically connecting the fifth conductive pad and the sixth conductive pad.

7. The semiconductor device of claim 6, wherein the penetrating electrodes include a first penetrating electrode extending vertically in the third semiconductor substrate and a second penetrating electrode electrically connected to the first penetrating electrode and extending vertically in the fourth semiconductor substrate.

8. The semiconductor device of claim 1, wherein the first body of metal contacts a top surface of the intermediate connection.

9. The semiconductor device of claim 1, wherein at least one of the first, second and third semiconductor substrates includes an integrated circuit selected from the group consisting of a sensing circuit, a logic circuit, and a memory circuit of an image sensor.

10. A semiconductor device, comprising:
a first semiconductor substrate including a first wiring layer having a first conductive pad therein;
a second semiconductor substrate disposed on the first semiconductor substrate and including a second wiring layer having a second conductive pad therein;
a first oxide layer disposed on the second semiconductor substrate;
a third semiconductor substrate disposed on the first oxide layer and including a third wiring layer having a third conductive pad therein;
an intermediate connection extending vertically in the device within the second semiconductor substrate and the first oxide layer; and bodies of metal located at respective surfaces of the first oxide layer and the third wiring layer and facing each other so as to together constitute a metal bond, wherein the second conductive pad and the third conductive pad are electrically connected via the intermediate connection and the metal bond.

11. The semiconductor device of claim 10, further comprising a layer of interconnect metal (IM) extending within the first oxide layer and electrically connecting the intermediate connection and the metal bond.

12. The semiconductor device of claim 10, wherein a top surface of the first wiring layer and a bottom surface of the second wiring layer contact each other.

13. The semiconductor device of claim 10, wherein a top surface of the first oxide layer and a bottom surface of the third wiring layer contact each other.

14. The semiconductor device of claim 10, wherein:
the second wiring layer has a fourth conductive pad therein, and
the first conductive pad and the fourth conductive pad are electrically connected via a metal bond.

15. The semiconductor device of claim 10, wherein the metal bond contacts a top surface of the intermediate connection.

16. A semiconductor device, comprising:
a first semiconductor substrate including a first circuit layer and a first wiring layer of the device, the first circuit layer comprising a first integrated circuit (IC) electrically connected to the first wiring layer;
a second semiconductor substrate including a second circuit layer and a second wiring layer of the device, the second circuit layer comprising a second integrated circuit (IC) electrically connected to the second wiring layer, and the second wiring layer having a conductive pad,
the second semiconductor substrate disposed on and bonded to the first semiconductor substrate with the second wiring layer being disposed facing and electrically connected to the first wiring layer;
an intermediate connection extending vertically in the second semiconductor substrate and having a first end, at which the intermediate connection is electrically connected to the conductive pad of the second wiring layer, and a second end;
a first oxide layer disposed on the second semiconductor substrate, the second end of the intermediate connection extending within the first oxide layer; and
a third semiconductor substrate including a third circuit layer and a third wiring layer of the device, the third circuit layer comprising a third integrated circuit (IC) electrically connected to the third wiring layer, and the third wiring layer having a conductive pad, and
wherein the third semiconductor substrate is disposed on and bonded to the first oxide layer with the third wiring layer being disposed face-to-face with the first oxide layer such that an interface exists between the third wiring layer and the first oxide layer,
an integral metal body extends across and is circumscribed by the interface between the third wiring layer and the first oxide layer, and
the second end of the intermediate connection is electrically connected to the conductive pad of the third wiring layer via the metal body, the integral metal body constituting a metal bond between the intermediate connection and the conductive pad of the third wiring layer.

17. The semiconductor device of claim 16, wherein the first wiring layer has a first conductive pad, the second wiring layer has a fourth conductive pad of the device discrete from the conductive pad to which the intermediate connection is electrically connected at the first end of the intermediate connection,
- the second wiring layer is disposed face-to-face with the first wiring layer such that an interface exists between the first and second wiring layers, and
- a second integral metal body extends across the interface between the first and second wiring layers, and the first and the fourth conductive pads are electrically connected by the second integral metal body, the second integral metal body constituting a metal bond between the first and fourth conducive pads.

18. The semiconductor device of claim 16, further comprising a layer of interconnect metal (IM) extending in the oxide layer, wherein the integral metal body is interposed between and electrically connects the IM and the conductive pad of the third wiring layer.

19. The semiconductor device of claim 16, wherein the integral metal body is interposed between and contacts a top surface of the intermediate connection and a bottom surface of the conductive pad of the conductive pad of the third wiring layer.

20. An image sensor including the semiconductor device as claimed in claim 16, wherein the integrated circuits comprise a memory circuit constituting an electronic memory of the image sensor, a logic circuit, and a pixel array.

* * * * *